United States Patent
Kamitani

(10) Patent No.: US 6,956,391 B2
(45) Date of Patent: Oct. 18, 2005

(54) TESTING METHOD FOR ELECTRONIC COMPONENT AND TESTING DEVICE

(75) Inventor: Gaku Kamitani, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 104 days.

(21) Appl. No.: 10/669,695

(22) Filed: Sep. 25, 2003

(65) Prior Publication Data

US 2004/0061512 A1 Apr. 1, 2004

(30) Foreign Application Priority Data

Sep. 26, 2002 (JP) ......................................... 2002-280187
Aug. 29, 2003 (JP) ......................................... 2003-305820

(51) Int. Cl.$^7$ .......................... G01R 31/02; G01R 31/26
(52) U.S. Cl. ...................................... 324/760; 324/765
(58) Field of Search ................................ 324/760, 765, 324/750–769, 522–532, 605, 713; 713/322, 320

(56) References Cited

U.S. PATENT DOCUMENTS 6,476,617 B1 * 11/2002 Kawaguchi et al. ........ 324/548

FOREIGN PATENT DOCUMENTS

| JP | 6-102312 | 4/1994 |
|---|---|---|
| JP | 2000-228338 | 8/2000 |

* cited by examiner

Primary Examiner—Anjan Deb
Assistant Examiner—Amy He
(74) Attorney, Agent, or Firm—Keating & Bennett, LLP

(57) ABSTRACT

A testing method for an electronic component in which a predetermined load is set, which is determined by a burn-in temperature, a burn-in voltage, and a burn-in period of time, and burn-in of an electronic component is carried out in such a manner that a load equal to the predetermined load is applied to the electronic component, with the method including a first step of placing an electronic component having a negative resistance-temperature characteristic in a heating atmosphere so that the temperature of the electronic component reaches a predetermined temperature which is lower than the burn-in temperature, a second step of supplying constant current to flow through the electronic component so that the predetermined temperature of the electronic component is increased to the burn-in temperature, and a third step of comparing the voltage actually applied to the electronic component to the burn-in voltage, correcting the burn-in time-period based on the comparison to determine a corrected burn-in time-period, and applying constant current to flow through the electronic component based on the corrected burn-in time-period.

20 Claims, 6 Drawing Sheets

TESTING METHOD FOR ELECTRONIC COMPONENT AND TESTING DEVICE

BACKGROUND OF THE INVENTION

1. Field of the Invention

The present invention relates to a testing method and a testing device for a monolithic ceramic capacitor including a ceramic with a high dielectric constant, and another electronic component having a negative resistance-temperature characteristic.

2. Description of the Related Art

For such electronic components, various tests are carried out before the components are shipped as final products. As one of the tests, a burn-in test is performed. In a burn-in test, a predetermined load, which is determined by a constant voltage that is higher than a rated voltage of the component being tested, is applied at a constant temperature that is higher than its rated value for a predetermined short time (burn-in time). The burn-in of an electronic component is carried out in such a manner that a load that is equal to the above-described predetermined load is applied to the electronic component. Thereafter, the insulation resistance of the inside of the component is measured. An electronic component of which the insulation resistance becomes less than a predetermined value is determined to be a rejected product and is eliminated from the group of acceptable products.

When burn-in voltage is applied to an electronic component placed in the burn-in temperature atmosphere as described above, the electronic component is self-heated due to the load current. Therefore, the temperature of the electronic component does not practically become equal to the burn-in temperature which is set in a thermostat. Moreover, the self-heating temperature is dispersed depending on electronic components.

As a burn-in test which has been carried out and by which the self-heating temperature of an electronic component can be kept constant, and the burn-in can be accurately carried out, a method in which constant power is applied is known (e.g., see Japanese Unexamined Patent Application Publication No. 6-102312, page 4, FIG. 3).

However, the above-described known burn-in testing method can be applied to electronic components for which power consumption can be correctly controlled with the use of an external control signal. However, this testing method can not be applied to electronic components for which the power consumption can not be controlled.

SUMMARY OF THE INVENTION

In order to overcome the problems described above, preferred embodiments of the present invention provide a method of applying a predetermined load to an electronic component for which power consumption can not be controlled by application of only an external signal, and which has a negative resistance-temperature characteristic, while the self-heating temperature of the electronic component is kept constant.

According to a preferred embodiment of the present invention, a method for testing an electronic component in which a predetermined load is set, which is determined by a burn-in temperature, a burn-in voltage, and a burn-in period of time, and burn-in of an electronic component is carried out in such a manner that a load that is substantially equal to a predetermined load is applied to the electronic component, the method including a first step of placing an electronic component having a negative resistance-temperature characteristic in a heating atmosphere so that the electronic component reaches a predetermined temperature that is lower than the burn-in temperature, a second step of supplying a constant current to flow through the electronic component so that the predetermined temperature of the electronic component is increased to the burn-in temperature, and a third step of comparing the voltage that is actually applied to the electronic component having the burn-in temperature to the burn-in voltage, correcting the burn-in time-period based on the comparison to determine a corrected burn-in time-period, and applying constant current to flow through the electronic component based on the corrected burn-in time-period.

According to the testing method for an electronic component of this preferred embodiment of the present invention, in the first step, the electronic component reaches a predetermined temperature, e.g., by heating. In this case, no constant current flows through the electronic component. Thus, for the electronic component, self-heating, which is caused by the constant current, does not occur. In the second step, the constant current is supplied to flow through the electronic component so that the temperature of the electronic component is increased from the predetermined temperature to the burn-in temperature. Accordingly, the electronic component is self-heated due to the constant current flow in the second step, and the temperature of the electronic component is controlled to reach the burn-in temperature. Thus, the electronic component is set correctly at the burn-in temperature. In this case, in the third step, the actual burn-in time-period is controlled based on the actually applied voltage, the burn-in voltage, and the burn-in time-period. Thus, the total load is controlled correspondingly to a desired burn-in condition. Accordingly, the load required for the burn-in is applied to the electronic component. Thus, the burn-in can be carried out for any electronic component in an equivalent burn-in condition. That is, the burn-in can be accurately carried out for any electronic component.

Preferably, according to the testing method for an electronic component of a preferred embodiment of the present invention, in the second step, the voltage applied to the electronic component is monitored while the constant current flows to the electronic component, and the burn-in time-period is determined based on the monitoring results. In this case, the burn-in time-period is determined based on the voltage obtained when it is monitored, whether or not the constant current flows through the electronic component. Accordingly, the measurement of the constant current also provides the measurement of the burn-in voltage required for the burn-in. Therefore, the method becomes simple.

Also, preferably, according to the testing method for an electronic component of preferred embodiments of the present invention, the first step involves a process of, in advance, increasing the temperature of the electronic component to a temperature which is between a normal temperature (unheated, room temperature) and the burn-in temperature and is nearer to the burn-in temperature. This process of heating is performed by using a temperature-increasing mechanism. In this case, the electronic component reaches the burn-in temperature earlier compared to the case in which the constant current is supplied to flow through the electronic component which is at a normal temperature. Thus, the cycle time required for the testing is reduced. Thus, the test can be efficiently carried out.

Moreover, according to another preferred embodiment of the present invention, a testing device with which a predetermined load is set, which is determined by a burn-in temperature, a burn-in voltage, and a burn-in time-period, and the burn-in of an electronic component is carried out in such a manner that a load that is equal to a predetermined load is applied to the electronic component, includes a constant current source unit which supplies constant current to flow through the electronic component, and a burn-in control unit for controlling the operation of the constant current source unit, the burn-in control unit carrying out at least a temperature-increasing step at which the control unit drives the constant current source unit so that constant current flows through the electronic component, and thereby, the temperature of the electronic component is increased from a predetermined temperature to the burn-in temperature, and a burn-in controlling step at which the voltage actually applied to the electronic component having the burn-in temperature is compared with the burn-in voltage, correction-calculation of the burn-in time-period is carried out based on comparison results, and the burn-in of the electronic component is carried out at the burn-in temperature in compliance with the corrected burn-in time-period.

In this case, the constant current source unit includes a circuit or device for supplying constant current, not including a control unit for the supply of the constant current. The control for the constant current is carried out by the burn-in control unit.

According to the testing device for an electronic component of a preferred embodiment of the present invention, the constant current is supplied from the constant current source unit to flow through the electronic component, and thereby, the temperature of the electronic component is increased from the predetermined temperature to the burn-in temperature. In particular, the electronic component is self-heated by the constant current flow. The temperature of the component is set accurately at the burn-in temperature by the burn-in control unit. In this case, the burn-in time is controlled and corrected based on the voltage that is actually applied, the burn-in voltage, and the burn-in time-period, so that the total load is controlled correspondingly to a desired burn-in condition. Accordingly, a load required for the burn-in is applied to the electronic component. Thus, the burn-in can be carried out for any electronic component in an equivalent burn-in condition. The burn-in test can be accurately made for electronic components.

Preferably, the testing device for an electronic component of a preferred embodiment of the present invention further includes a temperature-increasing mechanism which increases the temperature of the electronic component from a normal, unheated temperature to the predetermined temperature before the constant current is supplied from the constant current source unit to flow through the electronic component. In this case, the electronic component reaches the burn-in temperature earlier compared to the case in which the constant current is supplied to the electronic component which is at a normal temperature. Thus, the cycle time required for the test is greatly reduced. Thus, the test can be efficiently carried out.

Preferably, in the testing device for an electronic component of a preferred embodiment of the present invention, the burn-in control unit includes a negative feedback control unit which compares the actual current flowing through the electronic component with the set current and reduces the difference between the currents.

Preferably, in the testing device for an electronic device, the burn-in control unit includes a correction unit, which measures the actual current flowing through the electronic component, calculates a correction amount required to equalize the actual current to the set current, based on the measuring results, and corrects the actual current based on results of the calculation.

Preferably, the testing device for an electronic component of a preferred embodiment of the present invention further includes a constant current source unit which can simultaneously supply constant current to flow through a plurality of electronic components, respectively. In this case, the burn-in can be carried out for a plurality of electronic components, and thus, rejected products can be efficiently identified and eliminated.

According to a preferred embodiment of the present invention, the range in which the temperature of a burn-in electronic component is increased becomes constant by the supply of constant current. Moreover, the change of the load applied to a sample can be easily determined by the voltage. Furthermore, the burn-in time-period can be sufficiently adjusted. Thus, a constant load can be applied to each electronic component. The burn-in of electronic components can be performed with high reliability.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Figure 1:
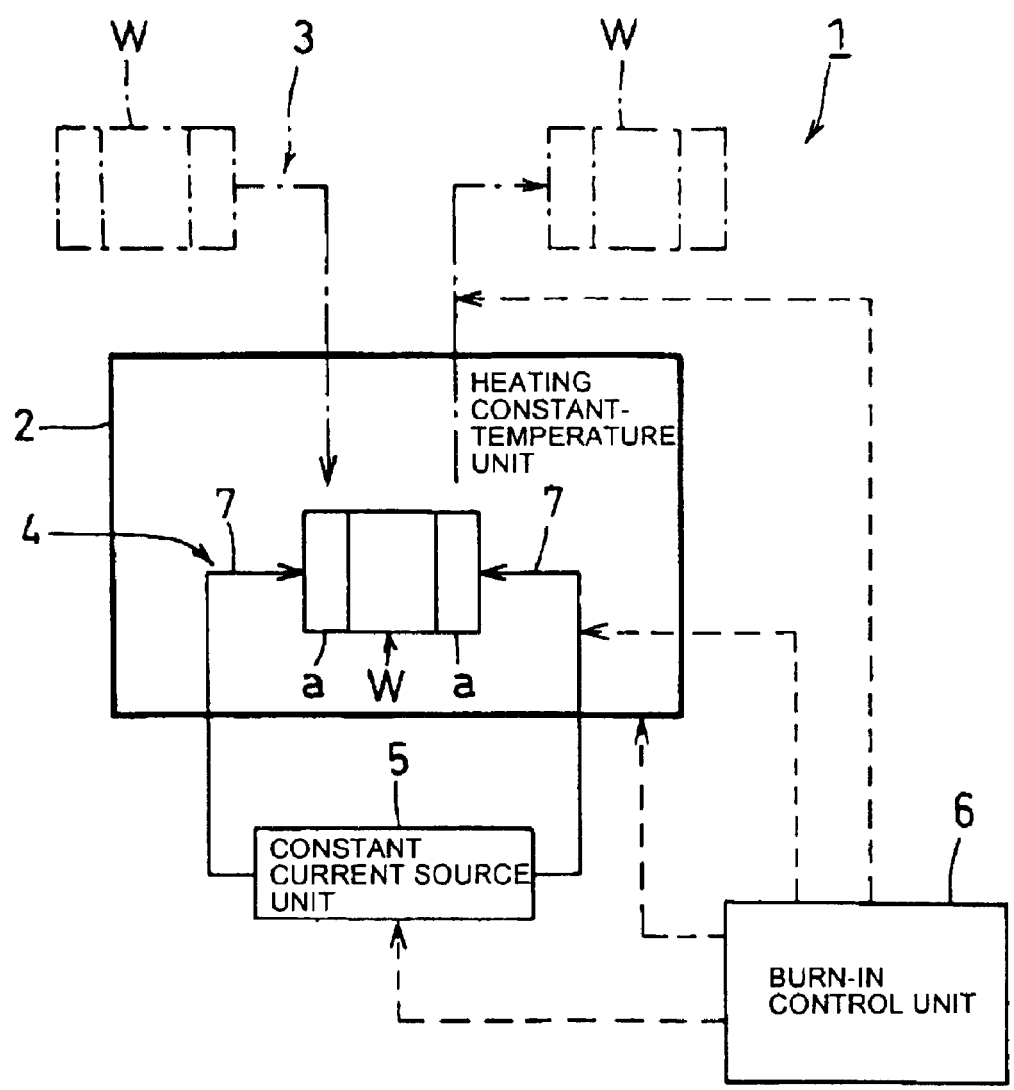
FIG. 1 schematically shows the configuration of a burn-in testing device which is used to carry out a testing method for an electronic component according to a preferred embodiment of the present invention.
Figure 2:
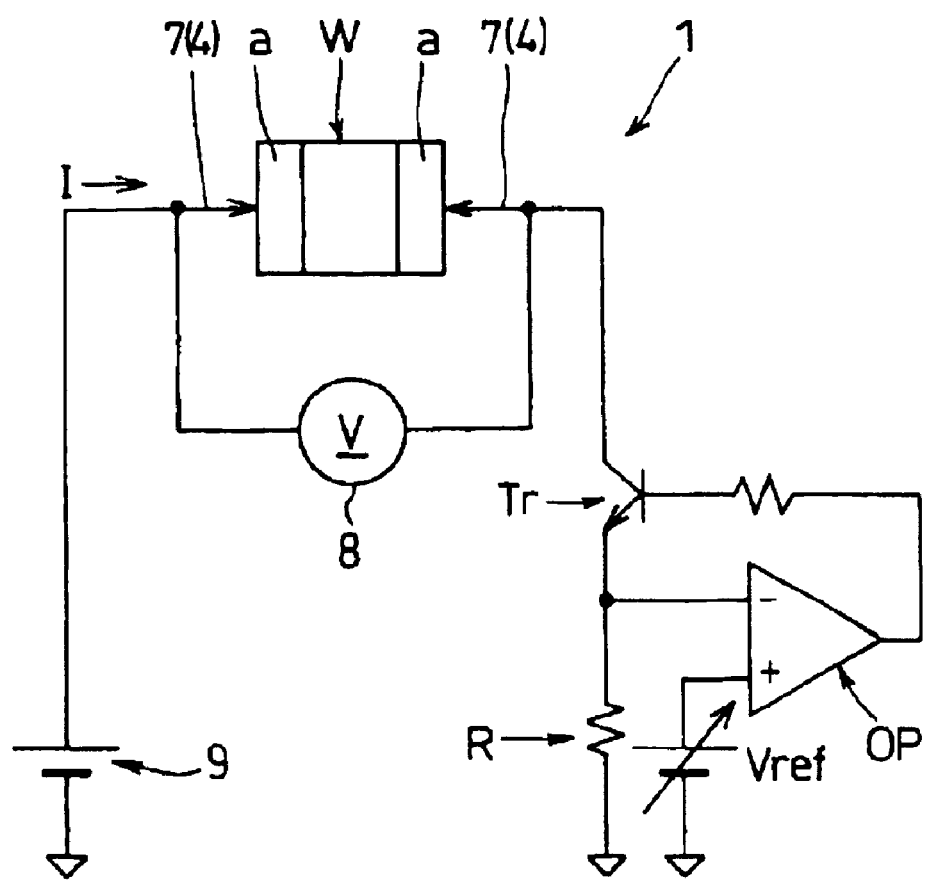
FIG. 2 schematically shows the configuration of an essential portion of a constant current source unit of the burn-in testing device of FIG. 1.
Figure 3:
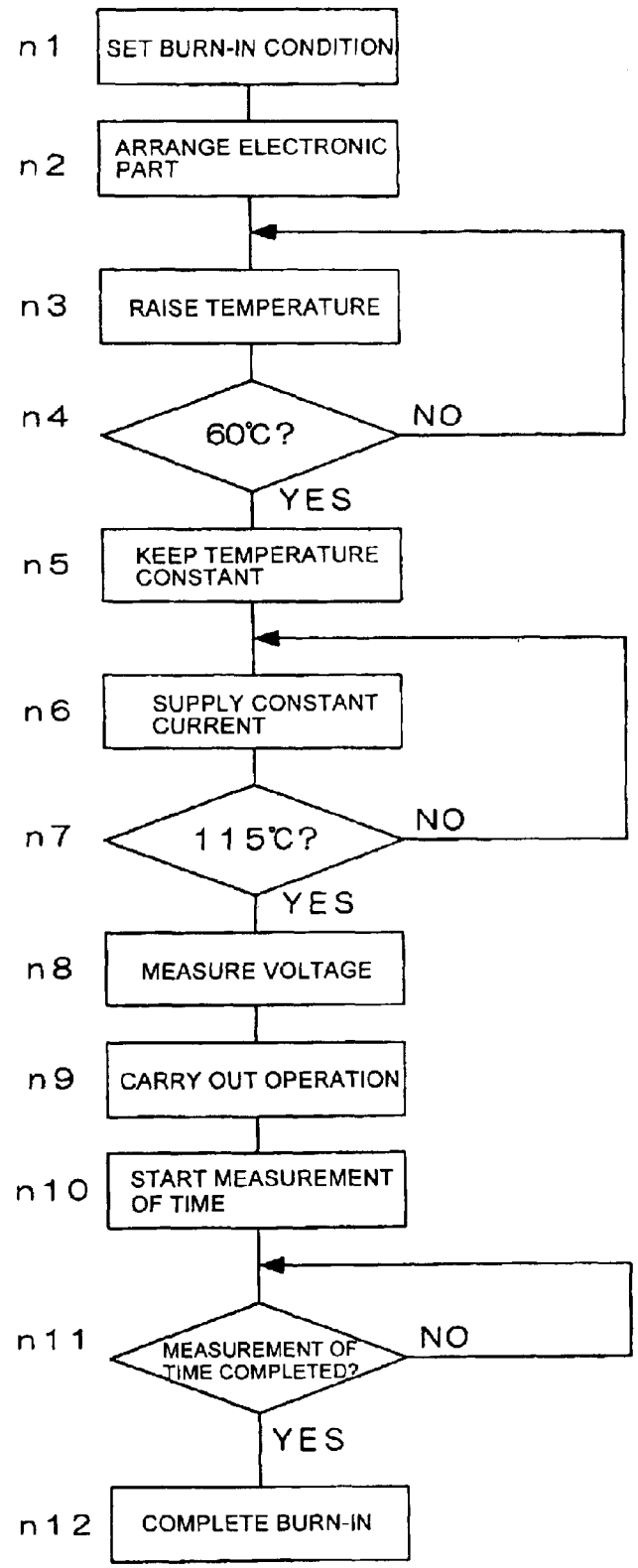
FIG. 3 is a flowchart showing the processes of a burn-in testing method according to a preferred embodiment of the present invention.

A testing method for an electronic component and a testing device according to preferred embodiments of the present invention will be described with reference to FIGS. 1 to 3. FIG. 1 schematically shows the testing device which is used to carry out the testing method. FIG. 2 schematically shows an essential portion of the testing device of FIG. 1. FIG. 3 is a flowchart of the testing method which is carried out with the testing device of FIG. 1.

In these drawings, a burn-in device 1 is shown as a testing device for an electronic component according to a preferred embodiment of the present invention. The burn-in device 1 carries out the burn-in testing of a high dielectric constant multilayer ceramic capacitor (hereinafter, referred to as a sample) as an example of the electronic component. The high dielectric constant multilayer ceramic capacitor is only an example of electronic components that can be used with the present invention, and any type of electronic component may be used in the preferred embodiments of the present invention.

The burn-in device 1 shown in the drawings preferably includes a heating constant temperature unit 2 having a thermostat which heats a sample W, and maintains the sample W at a constant temperature, a charging-discharging mechanism 3 which charges or discharges the sample W into and out of the heating constant temperature unit 2, a probing mechanism 4 which makes an electrical-connection to supply load-current or apply load-voltage to the sample W, a constant current source unit 5 which supplies the constant current to flow though the sample W, and a burn-in control unit 6 which carries out the control of the burn-in test.

With the charging/discharging mechanism 3, the sample W is placed in the heating constant-temperature unit 2 prior to the testing, and also, electric terminals (probes) 7 can be arranged to come into contact with the electrodes A of the sample W. Moreover, the charging/discharging mechanism 3 removes the tested sample W from the heating constant-temperature unit 2 after the completion of the burn-in test. As the charging/discharging mechanism 3, a manipulator may be used. Moreover, as the charging/discharging mechanism 3, a turntable, an endless belt, or other suitable device may be used.

The heating constant-temperature unit 2 has a temperature-increasing mechanism by which the temperature of the charged sample W is increased to a predetermined temperature $T_0$ (e.g., about 60° C.), and the predetermined temperature is maintained. In particular, the heating constant-temperature unit 2 has an internal space in which the sample W is accommodated and placed at a predetermined burn-in position. The unit 2 has a casing structure that is suitable for heating and temperature-regulation, and also has a mechanism for heating and temperature-regulation of the sample W arranged therein. In practice, since the sample W itself can not be directly heated, hot air is applied to the sample W, or the sample is caused to contact a heat source such as a hot plate or other suitable device to increase the temperature of the sample W. In this case, the target temperature $T_0$ is different from the temperature $T_1$ at which the burn-in should be carried out (e.g., about 115° C.), and is lower than the burn-in temperature $T_1$, such that $(T_0<T_1)$.

The probing mechanism 4 for the sample W causes the electric terminals 7 of the sample W to contact the electrodes A of the sample. The electric terminals 7 are connected to the constant current source unit 5.

The constant current source unit 5 supplies current I (A) to flow through the sample W via the electric terminals 7. As a result, power expressed as $I^2R$ (W) is generated in which R is a resistance (Ω) of the sample W. Thereby, the temperature of the sample W is increased. The temperature of the sample W is stabilized when the heating value becomes balanced with the amount of heat that externally flows out. In the case of high dielectric constant type ceramic capacitors, generally, the resistance R is significantly decreased with increases in the temperature. Therefore, when the current I (A) is constant, the generated power $I^2R$ is decreased. That is, negative feedback is provided. Even if the initial resistances of samples are dispersed, eventually, any sample can be stabilized and maintained at a substantially constant temperature. Thus, the temperature $T_0$ and the current I of the sample W before the current is supplied to flow through the sample W are set in advance, in such a manner that the temperature of the sample becomes nearly equal to the temperature T1 at which the burn-in should be carried out.

As clearly understood from the above-description, preferred embodiments of the present invention are effective for samples of which the resistance R is decreased with increases in the temperature T, that is, which have a so-called negative resistance-temperature characteristic. In this preferred embodiment, the multilayer ceramic capacitor with a high dielectric constant is preferably used as the sample. Further, the present invention can be applied to tests of thermistors or other components having a negative resistance-temperature characteristic.

Hereinafter, examples of the constant current source unit 5 and so forth will be described. For example, the constant current source unit 5 may have a circuit configuration shown in FIG. 2. The constant current source unit 5 is a constant current circuit. When current I, which is supplied from a DC electric source 9 as an applied voltage source to flow through the sample W, flows through a current control transistor Tr and a resistor R to GND, the voltage IR generated across the resistor R is compared with a set voltage $V_{ref}$ by an operational amplifier OP. When the current I is excessively large, the base voltage of Tr is decreased. When the current I is excessively small, the base voltage of TR is increased. That is, a negative feedback is provided, and thereby, the constant current I is constantly supplied to flow through the sample W. In FIG. 2, a bipolar transistor is preferably used as the transistor Tr. Preferably, a field-effect transistor (FET) is used instead of the bipolar transistor, since errors in current, which may be caused by a gate current, are reduced by the use of the field-effect transistor. Many configurations for the constant current circuit have been known. The above-described example is not restrictive. Different types of configurations can be used.

Hereinafter, the burn-in control unit 6 will be described. The burn-in control unit 6 controls the respective units of the burn-in device, in which the sample W is charged, the terminals are caused to contact the sample W, and the control unit 6 waits for the sample W to reach a desired temperature $T_0$, then further constant current is supplied to flow so as to carry out the burn-in, and the sample W is then removed.

The burn-in control unit 6, in addition to performing controlling operations such as probing for the sample W or the like, monitors the voltage applied to the sample W while constant current flows through the sample, and determines an application time for the sample W in such a manner that a desired load is applied to any sample depending on the voltage. Moreover, the burn-in control unit 6 controls the constant current source unit 5 so as to stop supplying the constant current to the sample W when a desired application time has passed.

The burn-in control unit 6 preferably includes a voltage measuring unit 8. The voltage measuring unit 8 measures voltage applied to the sample W when the burn-in is carried out with the constant current flow. Preferably, the voltage measuring unit 8 is preferably a meter such as a digital multi-meter. For measurement and so forth, the voltage measuring unit 8 may be connected to the electric terminals 7 which are connected to the sample W.

In the state in which the constant current flows, the applied voltage becomes high or low, depending on the resistance of the sample W. The burn-in control unit 6, which starts the constant current flow, that is, starts the burn-in, detects and monitors the voltages applied to the sample W via the voltage measuring unit 8. The burn-in time-period is adjusted correspondingly to the voltage detected by the voltage measuring unit 8, so that the load applied to the sample W becomes constant irrespective of the sample W.

By this adjustment, the application time-period is decreased when the detected voltage is higher than the standard condition, and is increased when the detected voltage is low. The application time-period to be adjusted is determined by a change in the load applied to the sample W with respect to the voltage. For example, in the case in which the voltage becomes higher than the standard condition, and as a result, two times the load is applied, the application time is reduced to be half. Thus, as a whole, the load is adjusted to be constant.

More specific description will be made in reference to a sample W to which the load is proportional to the square of the voltage and of which the reliability can be secured by burning-in for approximately 10 minutes in the condition of about 115° C. and about 100 V, as previously identified. It is assumed that the thermal resistance of the probing mechanism 4 is about 200(° C./W). The burn-in control unit 6 controls the charging/discharging mechanism 3 to feed the sample W into the heating constant-temperature unit 2, and causes the electric terminals 7 to contact the electrodes A of the sample. The temperature of the heating constant-temperature unit 2 is set at about 60° C.

It is required to know in advance the current which is applied to the sample W via the electric terminals 7 so that the temperature of about 60° C. of the sample W can be increased to about 115° C. For example, this current is assumed to be about 0.8 mA. When the temperature of the sample W becomes about 60° C., the burn-in control unit 6 controls the constant current source unit 5 so that current of about 0.8 mA flows. Thereby, the temperature of the sample W is increased to about 115° C. The arrival temperatures are dispersed depending on the samples. However, the dispersion caused by the constant current flow is small. Ordinarily, the dispersion is within a range of ± several Celsius degrees. Moreover, the burn-in control unit 6 measures the voltage applied to the sample W. The voltage is assumed to be about 140 V. In this case, the load per unit time-period applied to the sample becomes about 1.96 times the load at the initial voltage of about 100 V ($140^2/100^2$=1.96). Thus, the time-period required to apply the same load as that of the initial condition to the sample is about 306 seconds (10 minutes/1.9=about 306 seconds). Thus, the burn-in control unit 6 causes the constant current source 5 to stop the application of the constant current about 306 seconds after the start of the application. The unit 6 controls and causes the charging/discharging unit 3 to remove the sample W. It should be noted that the burn-in condition (in this example, about 115° C., about 100 V, and about 10 minutes) and the relationship between the load and the voltage can be determined by calculation of the load at which initial faults can occur, using the load application time-period, the applied voltage, the temperature condition, and so forth as parameters.

The processes of the burn-in test will be briefly explained with reference to FIG. 3.

First, at step n1, burn-in conditions for a sample W are set and input from a burn-in condition setting unit (not shown) to the burn-in control unit 6. In this preferred embodiment, for convenience of explanation, the specified burn-in temperature is temporarily set at about 115° C., the burn-in voltage at about 100 V, the burn-in time-period at about 10 minutes (about 600 seconds), and the burn-in current at about 0.8 mA, respectively.

At step n2, the sample W is disposed at a predetermined burn-in position in the heating constant-temperature unit 2 by the charging/discharging mechanism 3.

At step n3, the burn-in control unit 6 controls the heating constant-temperature unit 2 so the temperature of the sample W is increased toward the predetermined temperature of about 60° C. which is lower than the burn-in temperature of the burn-in condition.

At step n4, the burn-in control unit 6 determines whether or not the ambient temperature of the sample W becomes approximately 60° C., which is the predetermined temperature. If so, the process is moved from step n4 to step n5.

At the step n5, the burn-in control unit 6 controls the heating constant temperature unit 2 so that the heating operation of the unit 2 is stopped, and simultaneously, the operation is moved to the constant temperature operation. The steps n1 to n5 are grouped in a first group of steps.

Figure 4:
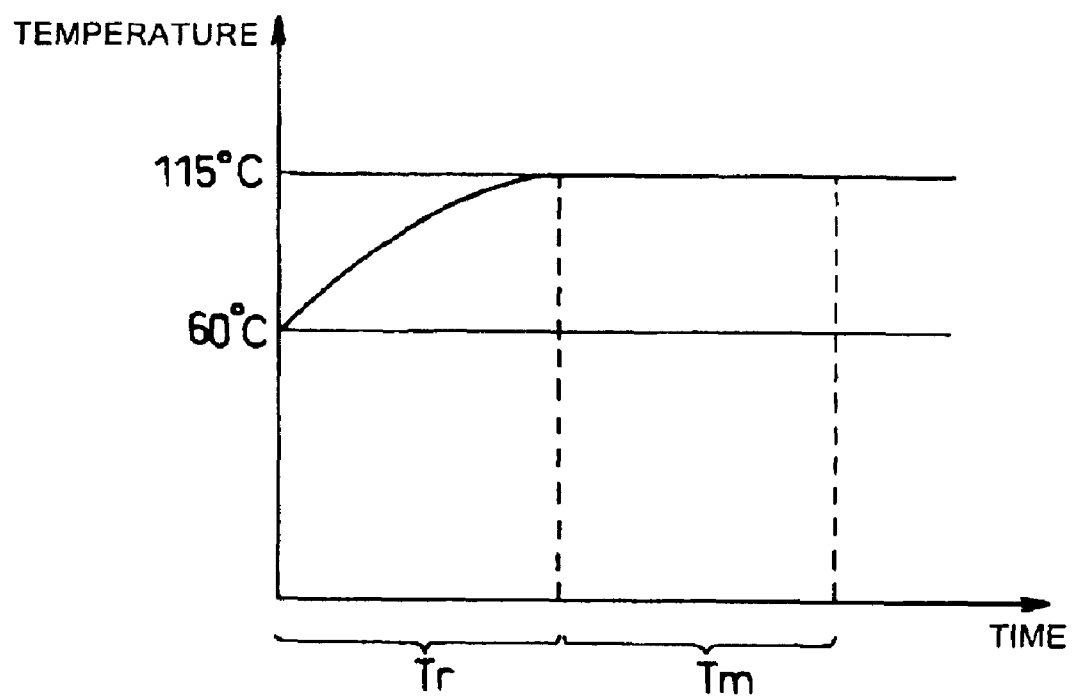
FIG. 4 is a graph showing the change of the temperature of an electronic component, obtained with the burn-in testing device of FIG. 1.
Figure 5:
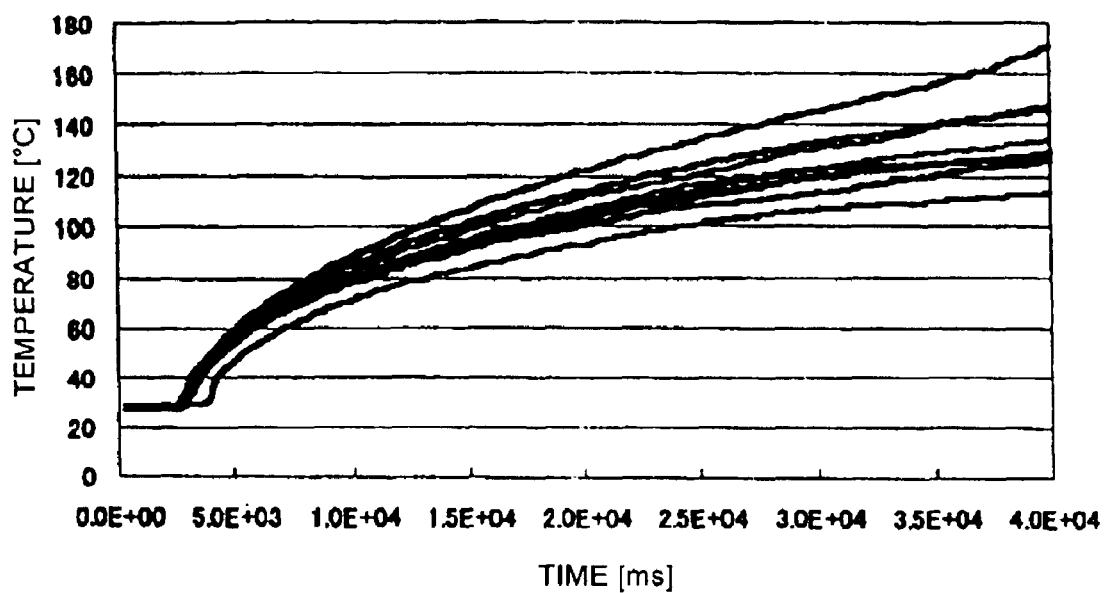
FIG. 5 is a graph showing the time-dependent change of the temperature of an electronic component when constant voltage is applied to the component.

At step n6, the burn-in control unit 6 drives the constant current source unit 5 so that constant current of about 0.8 mA flows through the sample W. The sample W through which the constant current flows is heated. Thus, the temperature of the sample W is increased by about 55° C. due to the thermal resistance of about 200(° C./W) of the probing mechanism 4 and the constant current of about 0.8 mA. FIG. 4 illustrates the temperature-increasing of the sample W. In FIG. 4, the time is plotted as abscissa, and the temperature is plotted as ordinate. A time-period Tr shows the time-period in which the temperature of the sample W is increased by about 55° C. from about 60° C. A time-period Tm shows the corrected burn-in time-period which will be described below. As shown in FIG. 4, the constant current I is applied to the sample W for self-heating. Then, the temperature of the sample W becomes stabilized at a constant value, that is, the burn-in temperature of about 115° C.

As described above, the sample W can be accurately set at the burn-in temperature by the self-heating.

In this case, at step n7, if the burn-in control unit 6 determines that the temperature has become about 115° C., the process is moved to setting of current and a time-period which are the burn-in conditions at step 8 and the succeeding steps. The steps n6 and n7 constitutes a second group of steps, and also correspond to a temperature-increasing control step.

At step n8, the burn-in control unit 6 measures the voltage applied to the sample W (actually applied voltage). In this case, at step n9, the measured actually applied voltage Vm is compared to the specified burn-in voltage Vb, based on the fact that the load is proportional to the square of voltage. Based on the comparison, the correction-calculation of the burn-in time-period is carried out according to the following calculation equation (1) with respect to the specified burn-in time Tb.

$$Tm=(Vm^2/Vb^2)\times Tb \qquad (1)$$

in which Tm is the corrected burn-in time-period, Vm is the actually applied voltage, Vb is the specified burn-in voltage, and Tb is the specified burn-in time.

At step n10, the measurement of the corrected burn-in time-period Tm is started. The constant current is supplied to flow until the measurement of the time-period Tm is completed at step n11. When the measurement of the correction burn-in time-period Tm is completed, the constant current flow is stopped. Thus, the burn-in is finished. The processes from the step n8 to the step n11 constitute a third step, and correspond to a burn-in control step.

In the above-described example, only one sample is processed. In practice, a device with which a plurality of samples are simultaneously processed can be used. Thus, the number of samples processed per unit time can be increased.

In practice, the voltage applied to the sample W after the constant current flow is started is changed with the resistance of the sample W. Thus, in practice, the voltage of the sample is measured at short time intervals. The burning-in is stopped at the time when the total load applied to the sample becomes equal to a predetermined amount (e.g., the total load is equal to that given in the condition of about 115° C., about 100 V and about 10 minutes). Moreover, in the above-described example, the sample W has a desired temperature (about 115° C.) immediately after the start of the constant current flow. In practice, a time-period is more or less taken for the increasing of the temperature. Thus, the burn-in may be additionally carried out during the time-period. Moreover, the load applied in the time-period may be calculated based on the temperature-increase curve (substantially, an exponential function), and thus, the burn-in time is controlled so that the total load applied to the sample by the burning-in becomes equal to a desired value.

Thereby, the burn-in can be carried out at a constant temperature at any time, irrespective of differences between the characteristics of the respective samples W. Thus, the reliability can be secured. This is due to the fact that the heat generated in the sample is substantially constant, since a constant current can always be applied to the sample, irrespective of the characteristics of the sample. Further, this is maintained by the probing mechanism 4 of which the thermal resistance is known. Thus, the range in which the temperature is increased, which may be caused by conduction of electricity, becomes constant.

According to preferred embodiments of the present invention, different voltages are applied to samples, respectively. Referring to this point, the voltage can be easily measured, and it can be known how much the load applied to the sample by the voltage is changed. Accordingly, a constant load can be applied to any sample by adjustment of the burn-in time-period for the sample. Thus, the burn-in can be performed with high reliability.

Hereinafter, another preferred embodiment of the present invention will be described.

In the above-described preferred embodiment, the burn-in is carried out in the heating constant-temperature unit preferably using a thermostat as a temperature-increasing mechanism. However, constant current may be supplied to flow through a sample of an electronic component which is in a normal ordinary temperature state (unheated, at room temperature), and the temperature is increased to a desired burn-in temperature. In this case, the heating constant-temperature unit is unnecessary. Generally, constant temperature baths have a large size and are expensive. Accordingly, no use of the heating constant-temperature unit realizes the reduction in size and cost of installations.

The burn-in can be carried out by heating the sample to a desired temperature, even if no closed space such as a constant temperature oven of which the ambience is controlled is used. Installations can be used which are suitable for inline-processing by which samples are continuously processed, not for batch-processing by which a plurality of samples are processed at the same time. In this case, the processing can be further rapidly performed, and also, the installations can be reduced in size and cost.

Still another preferred embodiment of the present invention will be described below.

A device for supplying constant current includes an electric source device which can control an output voltage and a meter which measures the current flowing through a sample. In particular, the burn-in control unit controls an electric source so that a voltage is applied to the sample, in which current flowing through the sample is measured. When the measured current is higher than a desired constant current, the voltage is decreased. When the current is lower than the desired constant current, the voltage is increased. Thereby, the current flowing through the sample becomes constant. In this case, referring to the burn-in control unit which causes the constant current unit to output a constant current, the control by the unit may be carried out using a controller having a microcomputer mounted thereon and software, not utilizing the circuit configuration.

Example of Preferred Embodiments of the Present Invention

Figure 6:
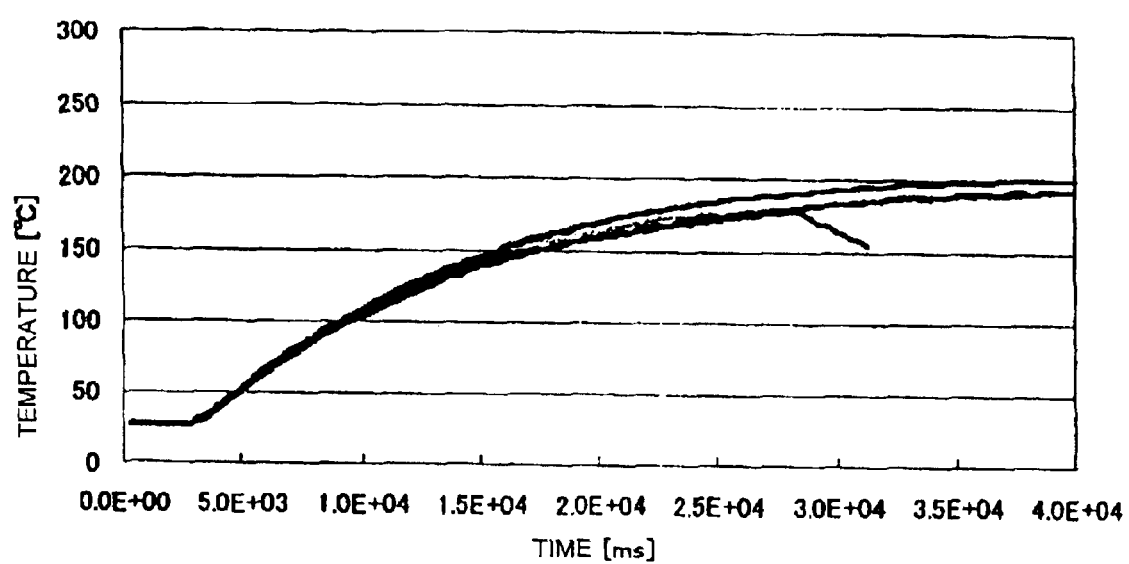
FIG. 6 is a graph shown the time-dependent change of the temperature of an electronic component when constant current is supplied to flow through the component.

The burn-in carried out by the application of constant voltage and the burn-in carried out by a constant current flow according to preferred embodiments of the present invention will be described below, based on the results of experiments performed by the inventors. A multilayer ceramic capacitor was used as a test object. A constant voltage of about 125 V was applied to the capacitor, and in this case, the temperature-increasing range was about 130° C. A constant current of about 2 mA was supplied to flow, and in this case, the temperature-increasing range was about 190° C. which was a higher temperature (the burn-in at a higher temperature was attempted not using a heating device). For both of the above-described cases, the change of the temperature after the start of the application was measured by a radiation thermometer. FIGS. 6 and 7 show the results. In FIGS. 6 and 7, the measurements results of a plurality of samples are overlapped and plotted.

In the case of the application of the constant voltage, the temperatures of the samples were dispersed in the range of about 110° C. to about 170° C., and moreover, for some samples, the temperature continued to increase after the observation time. The reason lies in that the resistance of the sample is decreased since the temperature of the sample is high, so that the heating value is increased, and this behavior is repeated. Thus, desired burn-in is impossible.

In the case of the constant current flow, the temperatures of all the samples are stable in the range of about 190° C. to about 200° C. The dispersion of the temperature is small compared to that in the case of the application of the constant voltage, though the temperature is increased to be higher. Moreover, the temperature is stable without the continuation of the temperature increases. That is, it has been revealed that the burn-in can be carried out in the stable temperature condition and with high reliability. The practically measured data shows that the burn-in can be carried out at a constant temperature even if the heating constant-temperature unit is not used.

As shown in FIG. 6, there is a sample of which the temperature starts to be decreased at about 2.8 E+04. This change of the temperature is caused by a rejected sample which is not durable to a stress caused by the constant current flow, so that a short-circuit fault occurs. The short-circuit fault occurs at the point at which the temperature of the sample starts to be decreased.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A method of testing an electronic component in which a predetermined load is set, which predetermined load is determined by a burn-in temperature, a burn-in voltage, and a burn-in period of time, and burn-in of the electronic component is carried out in such a manner that a load equal to the predetermined load is applied to the electronic component, the method comprising the steps of:

a first step of placing the electronic component having a negative resistance-temperature characteristic in a heating atmosphere such that the electronic component reaches a predetermined temperature, said predetermined temperature being lower than the burn-in temperature;

a second step of supplying constant current to flow through the electronic component so that the predetermined temperature of the electronic component is controlled to be increased to the burn-in temperature; and a third step of comparing the voltage actually applied to the electronic component to the burn-in voltage, correcting the burn-in time-period based on the comparison to determine a corrected burn-in time-period, and applying constant current to flow through the electronic component based on the corrected burn-in time-period.

2. A method according to claim 1, wherein, in the second step, the voltage applied to the electronic component is monitored while the constant current flows through the electronic component, and the burn-in time-period is determined based on results of the monitoring.

3. A method according to claim 1, wherein the first step includes the step of increasing the temperature of the electronic component to the predetermined temperature which is between a normal unheated temperature of the electronic component and the burn-in temperature and is nearer to the burn-in temperature, by using a temperature-increasing mechanism.

4. A method according to claim 1, wherein the electronic component is a high dielectric constant multilayer ceramic capacitor.

5. A method according to claim 1, wherein the predetermined temperature is about 60° C.

6. A method according to claim 1, wherein the burn-in temperature is about 115° C.

7. A method according to claim 1, wherein the burn-in time period is approximately 10 minutes.

8. A method according to claim 1, wherein the electronic component experiences self-heating during the second step in response to the application of the constant current.

9. A method according to claim 1, wherein a plurality of the electronic components are tested simultaneously according to the first step, the second step and the third step.

10. A method according to claim 1, wherein the burning-in is stopped at the time when the total load applied to the electronic component becomes equal to the predetermined load.

11. A testing device with which a predetermined load is set, which is determined by a burn-in temperature, a burn-in voltage, and a burn-in time-period, and the burn-in of the electronic component is carried out in such a manner that a load that is equal to the predetermined load is applied to the electronic component, the testing device comprising:

a constant current source unit which supplies constant current to flow through the electronic component; and a burn-in control unit for controlling the operation of the constant current source unit;

the burn-in control unit carrying out at least a temperature-increasing process during which the control unit drives the constant current source unit so that constant current flows through the electronic component, and thereby, the temperature of the electronic component is increased from a predetermined temperature to the burn-in temperature, and a burn-in controlling step at which the voltage actually applied to the electronic component is compared with the burn-in voltage, correction-calculation of the burn-in time-period is carried out based on comparison results, and the burn-in of the electronic component is carried out at the burn-in temperature in compliance with the corrected burn-in time-period.

12. A testing device for an electronic component according to claim 11, further comprising a temperature-increasing mechanism which increases the temperature of the electronic component from a normal temperature to the predetermined temperature before the constant current is supplied from the constant current source unit to flow through the electronic component.

13. A testing device for an electronic component according to claim 12, further comprising a charging/discharging unit including at least one of a turntable and an endless belt for charging and discharging the electronic component into and out of the temperature increasing mechanism.

14. A testing device for an electronic component according to claim 11, wherein the burn-in control unit includes a negative feedback control unit which compares actual current flowing through the electronic component with a set current and reduces the difference between the currents.

15. A testing device for an electronic component according to claim 11, wherein the burn-in control unit includes a correction unit which measures the actual current flowing through the electronic component, calculates a correction amount required to equalize the actual current to the predetermined current based on results of the measurement, and corrects the actual current based on results of the calculation.

16. A testing device for an electronic component according to claim 11, further comprising a constant current source unit which simultaneously supplies constant current to flow through a plurality of electronic components, respectively.

17. A testing device for an electronic component according to claim 11, wherein the constant current source unit includes a current control transistor, a resistor, and an operational amplifier.

18. A testing device for an electronic component according to claim 11, wherein the burn-in control unit includes a voltage measuring unit.

19. A testing device for an electronic component according to claim 11, wherein the electronic component is a high dielectric constant multilayer ceramic capacitor.

20. A testing device for an electronic component according to claim 11, wherein the predetermined temperature is about 60° C. and the burn-in temperature is about 115° C.

* * * * *